United States Patent
Mosinskis et al.

(10) Patent No.: US 6,472,918 B1
(45) Date of Patent: Oct. 29, 2002

(54) SELF-REFERENCING SLICER METHOD AND APPARATUS FOR HIGH-ACCURACY CLOCK DUTY CYCLE GENERATION

(75) Inventors: Paulius M. Mosinskis, Richlandtown, PA (US); Amit Gattani, Tinton Falls, NJ (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/378,882

(22) Filed: Aug. 23, 1999

(51) Int. Cl.[7] ................................................. H03K 5/04
(52) U.S. Cl. ........................ 327/175; 327/165; 327/172
(58) Field of Search ................................. 327/172, 175, 327/165, 100, 104

(56) References Cited

U.S. PATENT DOCUMENTS

| | | | | |
|---|---|---|---|---|
| 4,689,819 A | * | 8/1987 | Killion | 381/68 |
| 4,937,842 A | | 6/1990 | Howell | 375/345 |
| 5,057,702 A | * | 10/1991 | Kitagawa et al. | 327/175 |
| 5,257,026 A | | 10/1993 | Thompson et al. | 341/118 |
| 5,305,004 A | | 4/1994 | Fattaruso | 341/120 |
| 5,517,249 A | | 5/1996 | Rodriguez-Cavazos et al. | 348/465 |
| 5,583,501 A | | 12/1996 | Henrion et al. | 341/118 |

FOREIGN PATENT DOCUMENTS

JP    362032717    *    2/1987    .................. 327/175

OTHER PUBLICATIONS

"An Overview of Basic Concepts"; J.C. Candy; Delta–Sigma Data Converters Theory, Design, and Simulation; Ch. 1, pp. 1–13.

"Linearity Enhancement of Multibit ΔΣ A/D and D/A Converters Using Data Weighted Averaging"; *IEEE Transactions on Circuits and Systems—II: Analog and Digital Signal Processing*, vol. 42, No. 12, Dec. 1995; pp. 753–762.

"A High Resolution Multibit Sigma–Delta Modulator with Individual Level Averaging"; *IEEE Journal of Solids State Circuits*, vol. 30, No. 4, Apr. 1995; pp. 453–460.1 Engineering Department, UCLA; 1989; pp. 647–650.

"Digitally Corrected MultiΣΔ Data Converters"; T. Caraltepe et al.; Electrical Engineering Department, UCLA; 1989; pp. 647–650.

* cited by examiner

*Primary Examiner*—Dinh T. Le
(74) *Attorney, Agent, or Firm*—Altera Law Group, LLC

(57) ABSTRACT

A system and method for regulating the duty cycle of a digital clock signal derived from an oscillator signal. The oscillator signal is DC-biased to a DC value representing an average DC value of an ideal digital clock signal having a 50% duty cycle. The DC-biased oscillator signal is compared to a reference voltage. The digital clock signal is generated as a substantially square wave signal having first and second logic levels, and is generated in response to the comparison of the DC-biased oscillator signal and the reference voltage. The DC component of the generated digital clock signal is then used as the reference voltage.

19 Claims, 7 Drawing Sheets

SELF-REFERENCING SLICER METHOD AND APPARATUS FOR HIGH-ACCURACY CLOCK DUTY CYCLE GENERATION

BACKGROUND OF THE INVENTION

1. Field of the Invention

This invention relates in general to clock signal generation, and more particularly to a method and apparatus for regulating the duty cycle of a digital clock signal derived from an oscillator signal.

2. Description of Related Art

Global communications continues to demonstrate rapid growth rates. As more people become accustomed to the convenience of electronic mail, web-based facsimile transmission, electronic commerce, telecommuting and high-speed Internet access, the demand on the telecommunications industry to provide adequate bandwidth to provide this type of service also increases. The growth in the number of people using electronic communications will only increase as the price of Internet access and Internet access devices such as personal digital assistants (PDAs), computers, etc. decreases.

Today, copper telephone lines service almost all voice traffic and most of the Internet traffic. However, as content rich applications continue to grow, both public and private copper access networks are being challenged. The local portion of the enterprise becomes a major challenge for access providers. To take advantage of the increasingly popular innovations in telecommunications technology, additional telephone lines are being installed in private residences and businesses.

Although analog modems have managed to stretch their potential speed to 56 kilobits per second (kbps), small-office/home-office (SOHO) customers need far greater Internet bandwidth to accommodate multimedia applications ranging form three-dimensional web sites to video conferencing. Analog modems cannot deliver the necessary bandwidth and, therefore, have reached the end of their usefulness.

In response to these developments, communications companies are responding with a variety of digital access solutions, all variants of Digital Subscriber Line (DSL) technology. These DSL technologies differ dramatically in their abilities to address major SOHO applications and the requirements of telephone companies.

DSL technologies are transport mechanisms for delivering high-bandwidth digital data services via twisted-pair copper wires. These copper wires provide the cabling between the telephone company's central offices and subscribers. DSL technology is a copper loop transmission technology that solves the bottleneck problem often associated with the last mile between Network Service Providers and the users of those network services. DSL technology achieves broadband speeds over ordinary phone wire. While DSL technology offers dramatic speed improvements (up to 7+ Mbps) compared to other network access methods, the real strength of DSL-based services lies in the opportunities driven by multimedia applications required by today's network users, performance and reliability and economics.

Without such transport mechanisms, subscribers would have to rely on T1 (1.5 Mbps) or E1 (2.0 Mbps) service, which requires the phone company to install expensive new cabling to every location that wants high-speed digital service. The installation costs make T1/E1 service expensive.

The original DSL service was ISDN DSL (ISDL), which was defined in the late 1980s. ISDL provides 160 kbps rates over a single twisted-pair at ranges up to 18,000 feet from the telephone company's central office. While this service has been deployed in many homes and small businesses around the world, the demands of multimedia applications are already challenging IDSL's bandwidth.

Asymmetric Digital Service Line (ADSL) is currently being embraced by residential web surfers for its ability to quickly download music and video files. ADSL refers to modem technology that transforms twisted copper pair (ordinary phone lines) into a pipeline for ultra fast Internet access. As the name suggests, ADSL is not asynchronous transmission, but rather asymmetric digital transmission, i.e., ADSL transmits more than 6 Mbps (optionally up to 8 Mbps) to a subscriber, and as much as 640 kbps (optionally up to 1 Mbps) in the other direction.

ADSL has the ability to increase normal phone line capacity by 99% via a digital coding technique. This extra capacity means that one could simultaneously assess the World Wide Web and use the telephone or send a fax. A user of this technology could have uninterrupted Internet access that is always on-line. This technology also has the potential to be a cost-effective solution for residential customers, telecommuters and small business.

Still, there is a need for symmetric high-speed connection. For example, small businesses have become increasingly dependent on sophisticated voice and data products and services for competing against larger corporations. Until now, the cost of providing small businesses with professional telephony and data services was prohibitive. However, integrated access and virtual public branch exchanges (PBXs) are providing small businesses with voice mail, high-speed Internet access, multiple business lines and sufficient capabilities for telecommuters.

As mentioned above, symmetric services were traditionally delivered by T1 and E1 lines. Within the DSL family, HDSL has long been used to provision T1 lines because its long reach requires regeneration-signal boosting only every 12,000 feet, compared with every 4,000 feet for other T1 provisioning techniques. In fact, HDSL's ability to simplify and cheapen T1 deployment has made HDSL by far the most established of the DSL technology family.

As an inexpensive and flexible replacement for leased T1 lines, the HDSL2 standards are eagerly awaited by the DSL industry. HDSL2 replaces the aging HDSL standard that required two copper pairs. HDSL2 uses only one copper pair and is potentially rate adjustable. HDSL2, which is being developed within the framework of the American National Standards Institute (ANSI, New York), promises to make HDSL more compelling in two ways. While HDSL was a proprietary technique, i.e., modems at the central office (CO) and the customer premises had to come from the same vendor, HDSL2 will be an interoperable standard in which modems can be mixed. Perhaps the biggest selling point of HDSL2, however, is that it can use one pair of copper wires instead of HDSL's two. Network service providers thus have a choice. HDSL and one-pair HDSL2 have about the same reach, while two-pair HDSL2 adds as much as another 4,000 feet of reach, depending on the gauge of copper and other conditions. Hoping to propel the new DSL technology into the business arena, eight chip makers and OEMs have formed a consortium for the HDSL2 standard.

A typical HDSL2 transceiver transmit path includes a framer, a data pump with an analog interface for coupling to the twisted-pair line. In the transmit function, the framer accepts a digital signal and outputs to the data pump a serial digital signal that includes the data payload plus an HDSL2 overhead. In the receive function, the framer receives HDSL frames from the data pump.

The data pump includes a transceiver and an analog front end for receiving the HDSL frames serially from the framer. The transceiver converts the HDSL frames into a transmit signal by first converting the HDSL frames into symbols. Typically, a modulator, such as a trellis code modulator (TCM) encodes the symbols into a pulse amplitude modulation (PAM) signal. The signal is further processed to condition and filter the PAM signal. The analog front end provides pulse shaping to analog signals. This process is reversed in the receive channel with echo cancellation provided to cancel most of the echoed transmit signal.

As mentioned, the analog front end includes a transmit and a receive channel. In the transmit channel, the analog front end receives a pulse width modulated signal stream from the transceiver. A switched capacitor circuit filter shapes the transmitted signal to meet specific spectral templates. The receive channel consists of an automatic gain control (AGC) stage and an analog-to-digital (A/D) converter. The AGC stage sets the amplitude to the optimum level to prevent saturation of the A/D converter.

Switched-capacitor circuits are needed in communication applications to implement accurate on-chip active filters. Switched-capacitor circuits are also often implemented in high linearity A/D and digital-to-analog (D/A) converters, and have also found their place in precision sample and hold circuits as well as sigma-delta modulation circuits. These switched-capacitor circuits therefore are very beneficial in xDSL environments such as the HDSL2 environment, since filtering, sample/hold, A/D and D/A conversion and modulation are common elements of HDSL transceivers.

Precise operation of switched-capacitor circuits requires precise control of the timing of clock signals used, for example, in sample and hold operations. Insufficient settling of sampled/held signals leads to nonlinearities in the output signals. Insufficient settling of sampled/held signals can occur due to bandwidth limitations of the operational amplifiers used in the system, and can also occur where the timing available to settle varies from chip-to-chip and may not end up with the appropriate settling time. The "timing" is provided by clock signals generated by some sort of clock sourcing device. Therefore, precise timing control of the clock timing is desired.

A traditional manner of guaranteeing a precise 50% duty cycle is to generate the original clock signal at twice the required frequency (2× clock signal), and divide this clock signal by two using a digital divide-by-2 frequency divider to arrive at the desired frequency (1× clock signal). The frequency divider triggers on the rising (or alternatively falling) edge of the 2× original clock, and the division generates the 50% duty cycle 1× clock signal. Where the 1× clock signal itself is already at a very high frequency and is to be generated using an external crystal oscillator, it may become impractical and cost prohibitive to generate a 2× clock signal where only half of its frequency will be used due to the subsequent division, all merely for the purpose of obtaining a more precise 50% duty cycle. Crystal oscillators generally increase in cost as the frequency rises, and can become relatively expensive at very high frequencies. Further, crystal oscillators are more difficult to operate in the fundamental mode of oscillation at very high frequencies. For at least these reasons, it is not desirable to generate accurate 50% duty cycles for clock signals using the technique of doubling the original clock frequency and dividing it down to the desired frequency.

It can be seen then that there is a need for a method and apparatus for creating very accurate 50% duty cycle clock signals, while avoiding the need to manipulate the frequency of the original clock signal. There is also a need for such a method and apparatus that is cost-effective and resource-efficient. The present invention provides a solution to these and other shortcomings of the prior art, and offers additional advantages over the prior art.

SUMMARY OF THE INVENTION

To overcome the limitations in the prior art described above, and to overcome other limitations that will become apparent upon reading and understanding the present specification, the present invention discloses a method and apparatus for regulating the duty cycle of a digital clock signal.

A method in accordance with the principles of the present invention includes a manner of regulating the duty cycle of a digital clock signal derived from an oscillator signal. The oscillator signal is DC-biased to a DC value representing an average DC value of an ideal digital clock signal having a 50% duty cycle. The DC-biased oscillator signal is compared to a reference voltage. The digital clock signal is generated as a substantially square wave signal having first and second logic levels, and is generated in response to the comparison of the DC-biased oscillator signal and the reference voltage. The DC component of the generated digital clock signal is then used as the reference voltage.

In accordance with another embodiment of the invention, a method is provided for regulating the duty cycle of a digital clock signal derived from an oscillator signal. The oscillator signal is DC-biased to a DC value representing an average DC value of an ideal digital clock signal having a 50% duty cycle. When the digital clock signal has an actual duty cycle of less than 50%, the DC-biased oscillator signal is sliced at a voltage below its DC component to effectively increase the DC component of the digital clock signal until the digital clock signal has a 50% duty cycle. Alternatively, when the digital clock signal has an actual duty cycle of greater than 50%, the DC-biased oscillator signal is sliced at a voltage above its DC component to effectively decrease the DC component of the digital clock signal until the digital clock signal has a 50% duty cycle.

Another aspect of the present invention provides an apparatus to regulate the duty cycle of a digital clock signal. The apparatus includes a DC referencing circuit to reference an input oscillator signal to a predetermined voltage to create a DC-shifted oscillator signal. A slicer is also provided, which includes a first input coupled to the DC referencing circuit to receive the DC-shifted oscillator signal and a second input coupled to receive a threshold voltage. The slicer further includes an output to supply the digital clock signal having a duty cycle proportional to a difference between a DC component of the digital clock signal and a DC component of the DC-shifted oscillator signal. The apparatus also includes a feedback circuit coupled between the output of the slicer and the second input, so that the DC component of the digital clock signal provides the threshold voltage at the second input of the slicer.

These and various other advantages and features of novelty which characterize the invention are pointed out with particularity in the claims annexed hereto and form a part hereof. However, for a better understanding of the invention and its advantages, reference should be made to the drawings which form a further part hereof, and to accompanying descriptive matter, in which there are illustrated and described specific examples of an apparatus in accordance with the invention.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for accurately regulating the duty cycle of a digital clock signal derived from an oscillator signal by offsetting the oscillator signal by a predetermined DC value and utilizing feedback principles to control the duty cycle of the digital clock signal.

In order to provide an example of a system configuration in which the present invention is applicable, a description of an HDSL2 system and general HDSL2 circuitry is provided. It should be recognized that the principles of the present invention are applicable in a variety of different technical applications, and the invention is not limited to use in a DSL environment. In fact, the principles of the present invention are applicable in any environment requiring precision in clock duty cycle generation. However, in order to provide an exemplary context for describing the present invention, FIGS. 1 and 2 set forth a brief description of an HDSL2 system and associated sampling, filtering, analog/digital conversion and modulation circuitry, in which the present invention is particularly useful.

Figure 1:
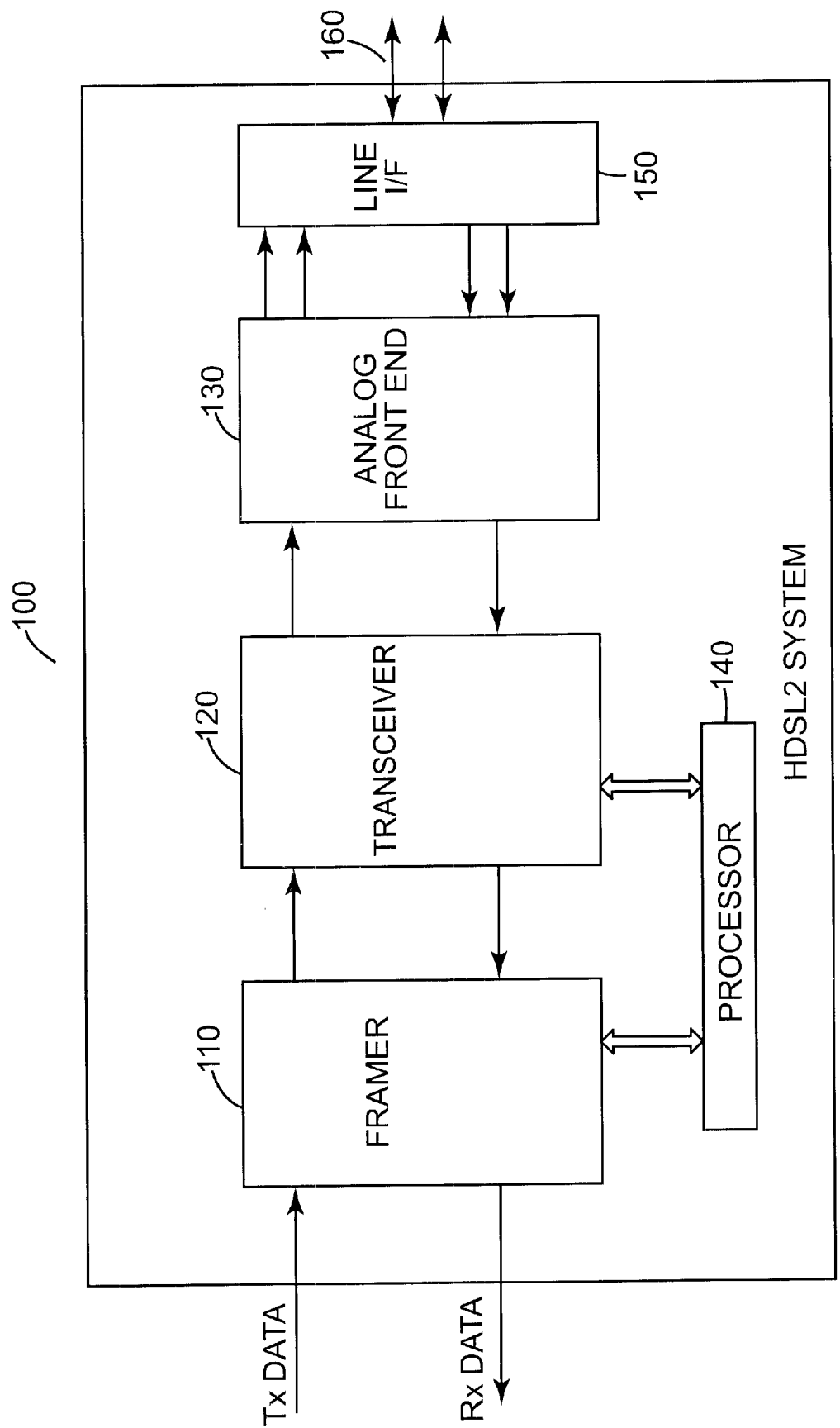
FIG. 1 illustrates a block diagram of one embodiment of an HDSL2 system in which the principles of the present invention may be applied.

FIG. 1 illustrates a block diagram of one embodiment of an HDSL2 system 100 in which the principles of the present invention may be applied. In FIG. 1, the system 100 includes a framer 110, a transceiver 120, and an analog front end 130. The framer 110 provides frame mapping to convert T1/E1 digital signals to HDSL2 frames. The transceiver 120 provides forward error correction, timing recovery, adaptive equalization, echo cancellation and modulation, e.g., pulse amplitude modulation. The framer 110 and transceiver 120 may be coupled to a processor 140. The analog front end 130 receives the HDSL2 frames in the form of a four-bit digital signal and converts the digital signal to an analog output after providing pulse shaping to shape the analog output signal to meet predetermined spectral templates. The analog front end 130 is coupled to a line interface 150 to interface the output of the analog front end 130 and the transmission medium 160, such as a twisted-pair.

Figure 2:
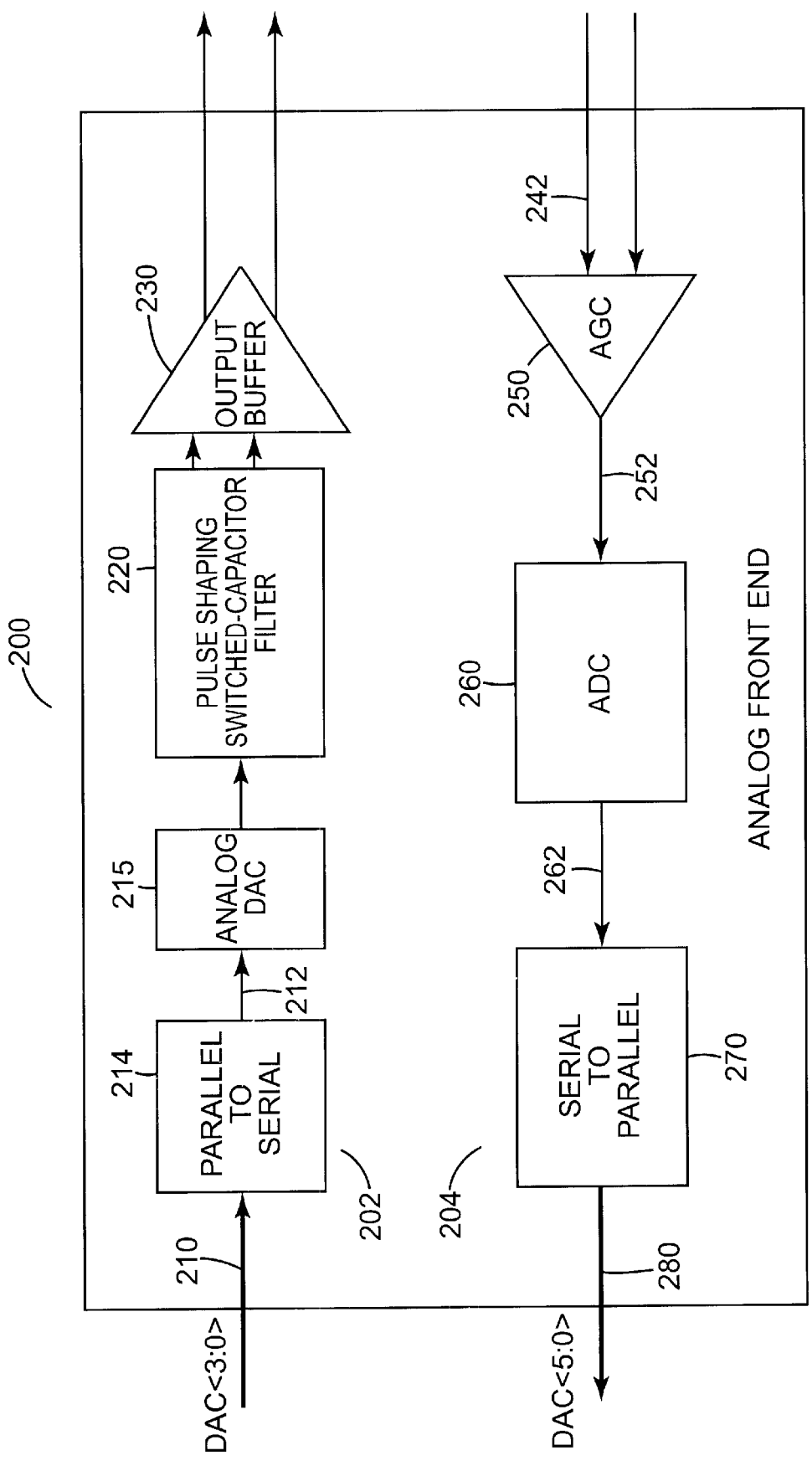
FIG. 2 illustrates a block diagram of an example analog front end of an example HDSL2 system.

FIG. 2 illustrates a block diagram of an example analog front end 200 of the HDSL2 system of FIG. 1. In FIG. 2, the four-bit, parallel digital signal 210 is received and converted to a serial signal 212 via the parallel-to-serial converter 214 in the transmit channel 202. The serial signal is shaped by the switched-capacitor filter 220. An output buffer 230 provides a unity gain, high input impedance, and low distortion, as well as the capability to drive low output impedance.

In the receive channel 204 of the analog front end 200, the analog signals 242 are received and processed by an automatic gain control (AGC) circuit 250. The output 252 from the AGC 250 is provided to an analog-to-digital (A/D) converter 260, e.g. a delta-sigma A/D converter. A serial-to-parallel converter 270 receives the digital signal 262 from the A/D converter 260 and provides a six bit, parallel signal 280 back to the transceiver 120.

In one embodiment of the invention, an HDSL2 system 100 is provided which has a need for precise control on the timing of clock signals used in sample and hold operations, which provides for precise operation of switched-capacitor circuits such as A/D and D/A conversion, active filtering, and modulation. In a particular HDSL2 application, the master clock available in the system must have very low jitter and close to 50% duty cycle. The present invention provides an apparatus and methodology that accurately forms a clock signal having a 50% duty cycle, which is particularly advantageous in communications systems such as the HDSL2 system 100.

In order to obtain an understanding of the structural and procedural aspects of the invention, a description of certain concepts relating to clock signals is first provided. The average value (e.g., voltage) of a square wave is equal to its peak amplitude multiplied by the ratio of time that the signal is at its peak amplitude versus the time corresponding to one period of the square wave. This is illustrated in Equation 1 below.

$$V_{AVG} = V_{PEAK}\left(\frac{t_{PEAK}}{period}\right) \quad \text{[Equation 1]}$$

Figure 3A:
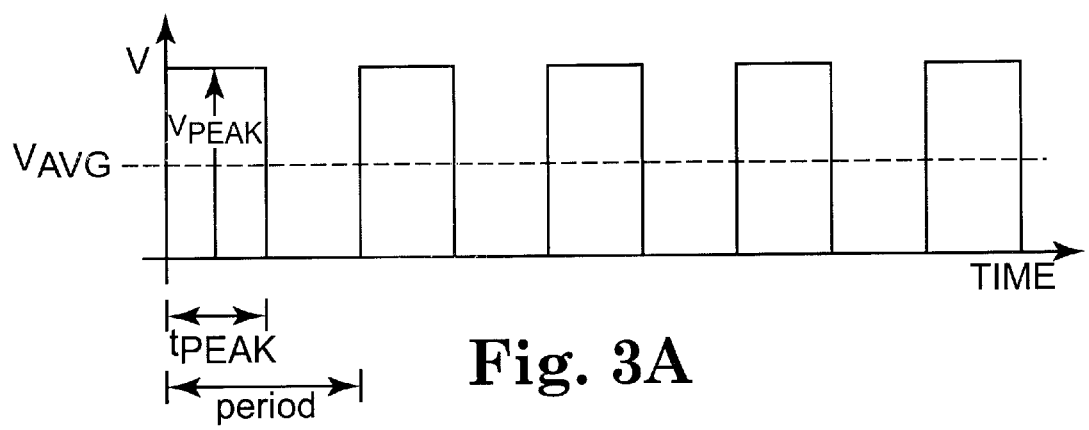
FIGS. 3A and 3B are waveform diagrams illustrating the relationship between average DC voltage and duty cycle for a periodic signal.
Figure 3B:
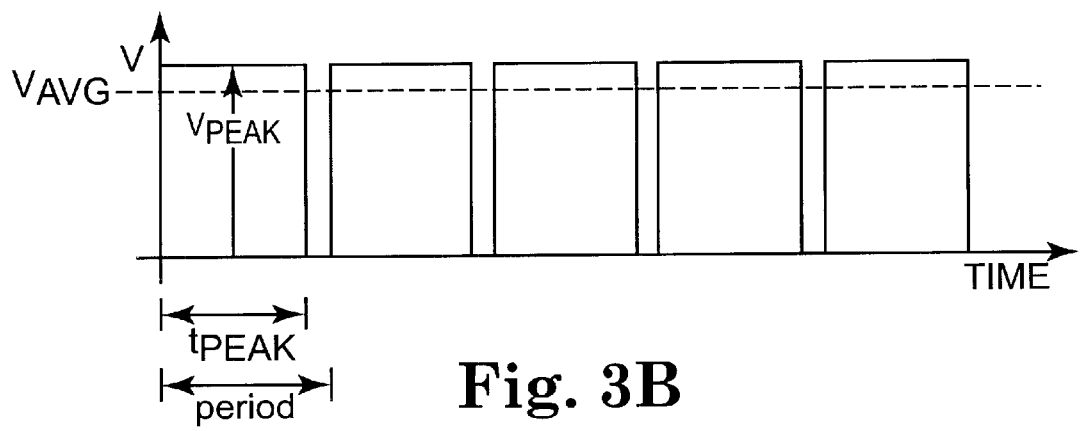

This is clearly illustrated by the examples shown in FIGS. 3A and 3B. In FIG. 3A, the time that the signal is at its peak amplitude is one half of the period. Referring to FIG. 3A and Equation 1, if $V_{PEAK}$ equals 5V, $t_{PEAK}$ is 1, and the period is 2, $V_{AVG}$ is equal to 2.5V. In FIG. 3B, even where $V_{PEAK}$ were to remain at 5V, the average voltage $V_{AVG}$ increases due to the larger ratio of $t_{PEAK}$ to the period.

Figure 4:
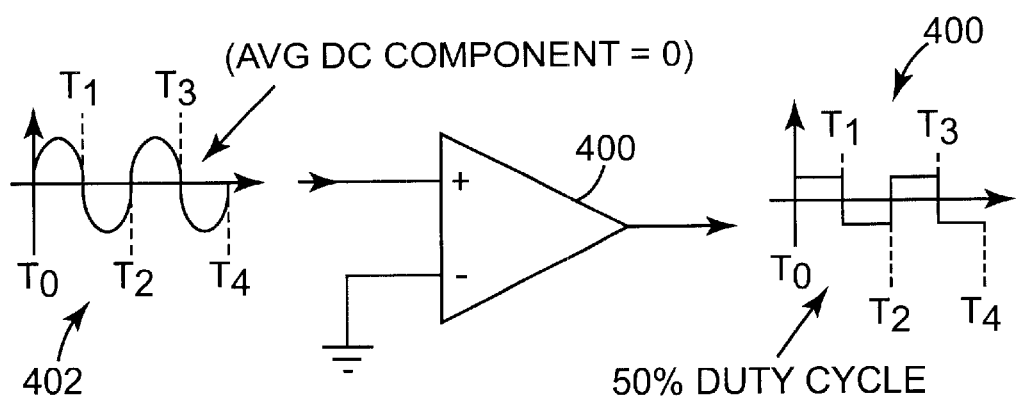
FIG. 4 is a block diagram of a slicer capable of producing a square wave output having a duty cycle proportional to the DC component of the periodic input signal.

FIG. 4 illustrates a concept used in connection with the present invention. It is often the case that crystal oscillators are used to generate an output sinusoid to ultimately produce a digital clock signal. While crystal oscillators typically generate output signals having very stable frequencies, the output sinusoid has varying DC levels as well as varying amplitudes. If such a sinusoid is coupled at the input of a slicer, such as a comparator, and the threshold for that slicer exactly represents the average (DC) level of the sine wave, an exact 50% duty cycle square wave will be obtained at the output of the slicer. In other words, if the DC level of the input and output waveforms are forced to be the same, and this value is set as the threshold voltage of the slicer, the output duty cycle will be exactly 50% high, 50% low (neglecting device mismatches).

FIG. 4 illustrates this concept. A slicer 400 is illustrated, having its inverting input coupled to ground, and its non-inverting input coupled to receive a sinusoidal waveform 402, such as an oscillator output sinusoid. In this example, the sinusoid is symmetric about the x-axis, and has an average DC component of zero volts. When the sinusoid is positive at the non-inverting input of the slicer 400, e.g., between times $T_0$ and $T_1$, the slicer output is at a high level between times $T_0$ and $T_1$ as shown in the square wave 404. Because the threshold voltage is equal to 0 (e.g., ground), and the average DC voltage of the sine wave 402 is equal to 0, the threshold exactly represents the average level of the sine wave, and an exact 50% duty cycle square wave 404 is produced.

In accordance with Equation 1, the average output voltage of a digital inverter reproducing a periodic clock with exactly 50% duty cycle is Vcc/2. It can be shown that, to a first order, the signal at the gate of a 3-port oscillator design (used in connection with one embodiment of the invention) is approximately sinusoidal. Therefore, if this sinusoid is made to have a DC content of Vcc/2, this voltage can be used as the threshold of the slicer, and a relatively accurate 50% duty cycle can be attained.

Figure 5A:
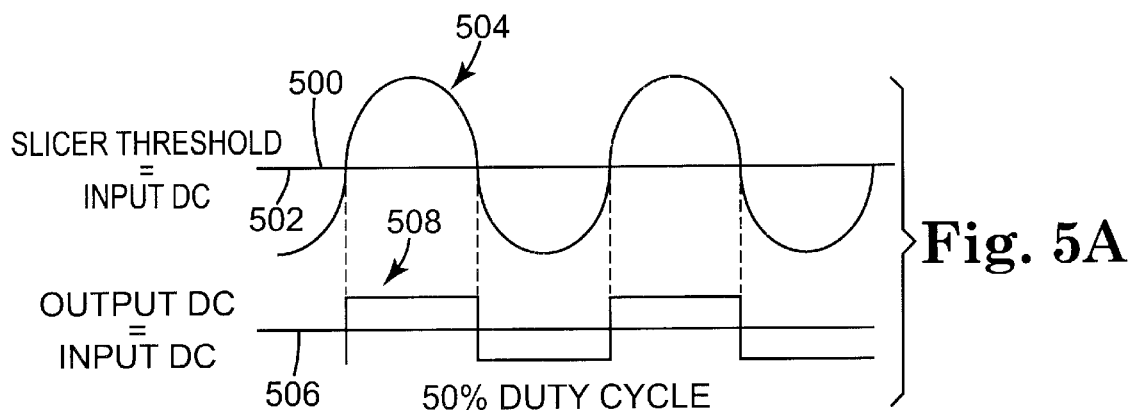
FIGS. 5A, 5B and 5C are waveform diagrams illustrating the proportional nature of the output DC level and the output duty cycle.
Figure 5B:
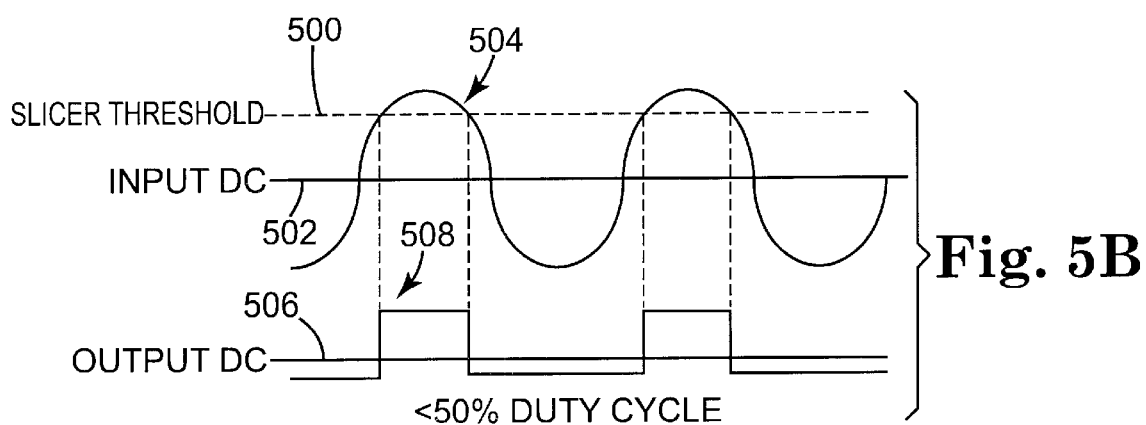
Figure 5C:
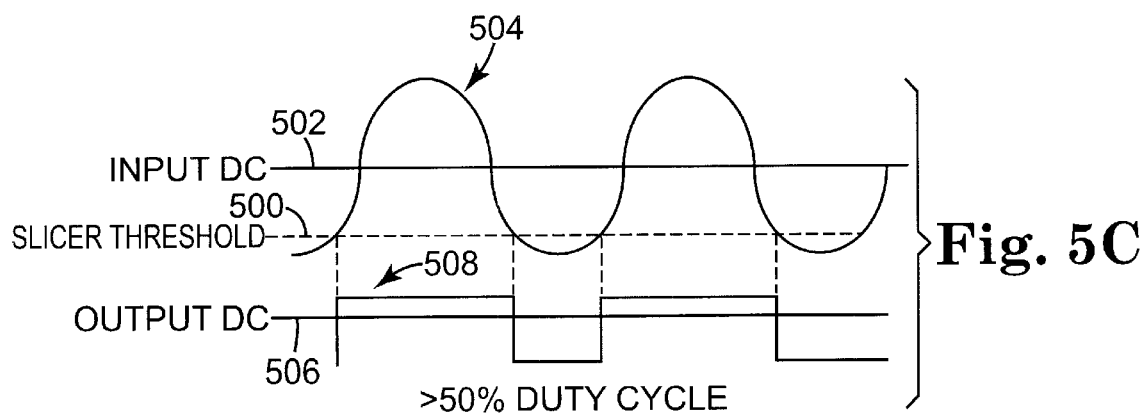

FIGS. 5A, 5B and 5C further illustrate that the output DC level is proportional to the output duty cycle. Referring first to FIG. 5A, an example is shown where the slicer threshold 500 (such as the voltage at the inverting input of slicer 400 of FIG. 4) is made equal to the input DC level 502 of the input sinusoid 504. In this instance, the output DC voltage 506 will equal the input DC voltage, and the resulting square wave 508 has a 50% duty cycle. Where the slicer threshold 500 becomes higher than the input DC 502, the output DC level 506 increases and the duty cycle decreases as shown in FIG. 5B. Where the slicer threshold 500 decreases below the input DC 502, the output DC level 506 decreases and the duty cycle increases as shown in FIG. 5C.

Figure 6A:
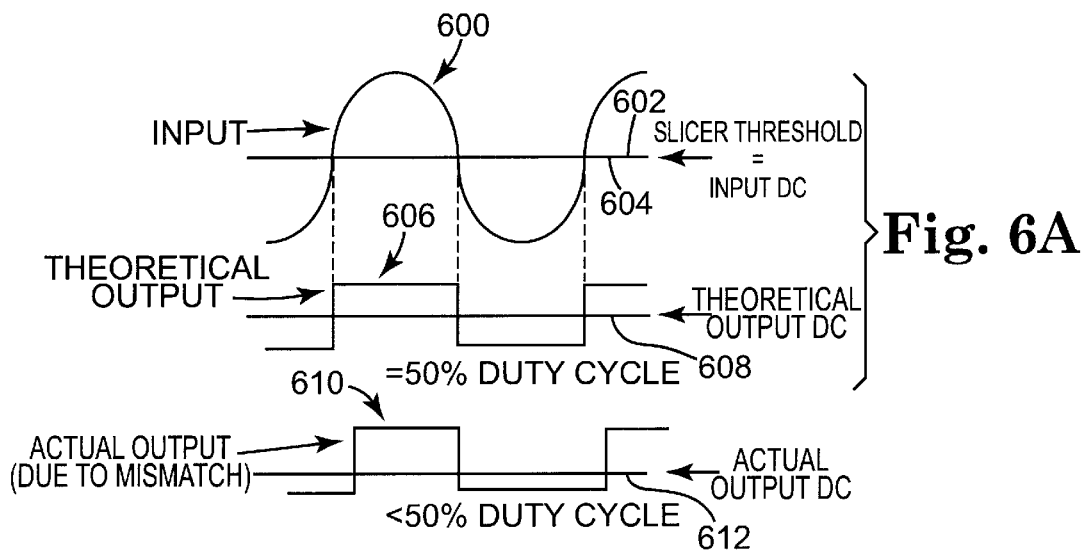
FIGS. 6A and 6B are waveform diagrams illustrating the effect of using the output DC level to adjust the input threshold voltage of the slicer in accordance with the principles of the present invention.
Figure 6B:
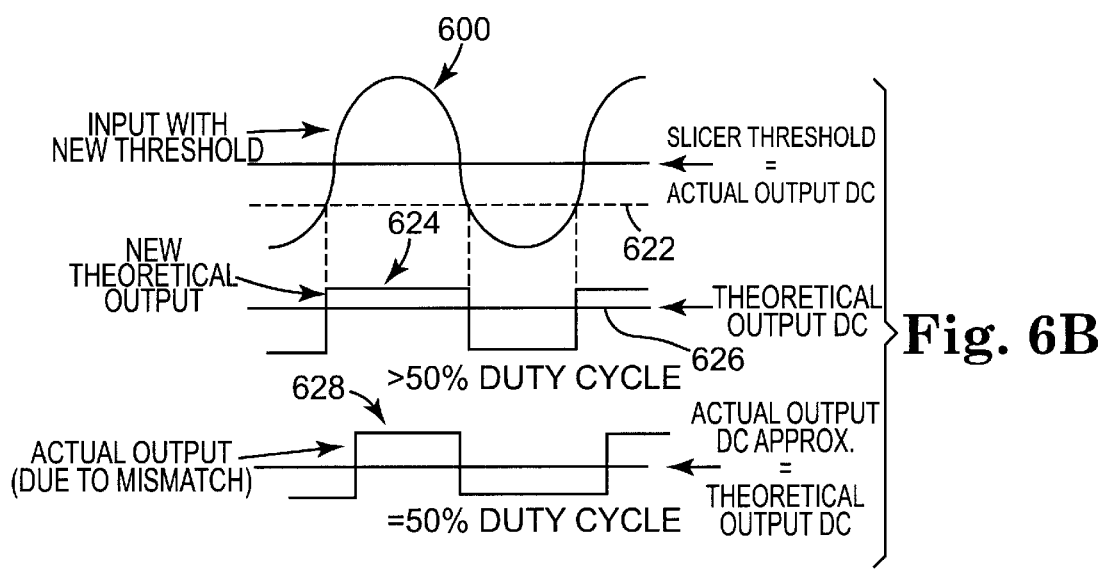

FIGS. 6A and 6B are waveform diagrams illustrating the effect of using the output DC level to adjust the input threshold voltage of the slicer. Referring to FIG. 6A, the input is represented as a sinusoidal waveform 600. In this case, the slicer threshold 602 equals the input DC level 604. The theoretical output square wave 606 would have a 50% duty cycle and the theoretical output DC 608 would be equal to the input DC. However, due to mismatch conditions, the actual output waveform 610 may not reflect the ideal 50% duty cycle and instead may have a reduced duty cycle due to the lower actual output DC level 612.

The present invention can compensate for such mismatch conditions. Referring to FIG. 6B, the input 620 is originally imparted a DC content of $V_{cc}/2$. However, the actual output DC 622 is at a lower DC level due to the lengthened time that the non-inverting input of the slicer will be presented with the higher input value. Therefore, the new theoretical output 624 has a higher theoretical output DC level 626 due to the duty cycle being greater than 50%. By way of feedback techniques, the higher theoretical output DC level 626 raises the slicer threshold to compensate for the additional DC content ($V_{cc}/2$) in the input. This causes the new output 628 to reduce its duty cycle back to the desired 50% duty cycle. This will be described more fully in connection with FIG. 7.

Figure 7:
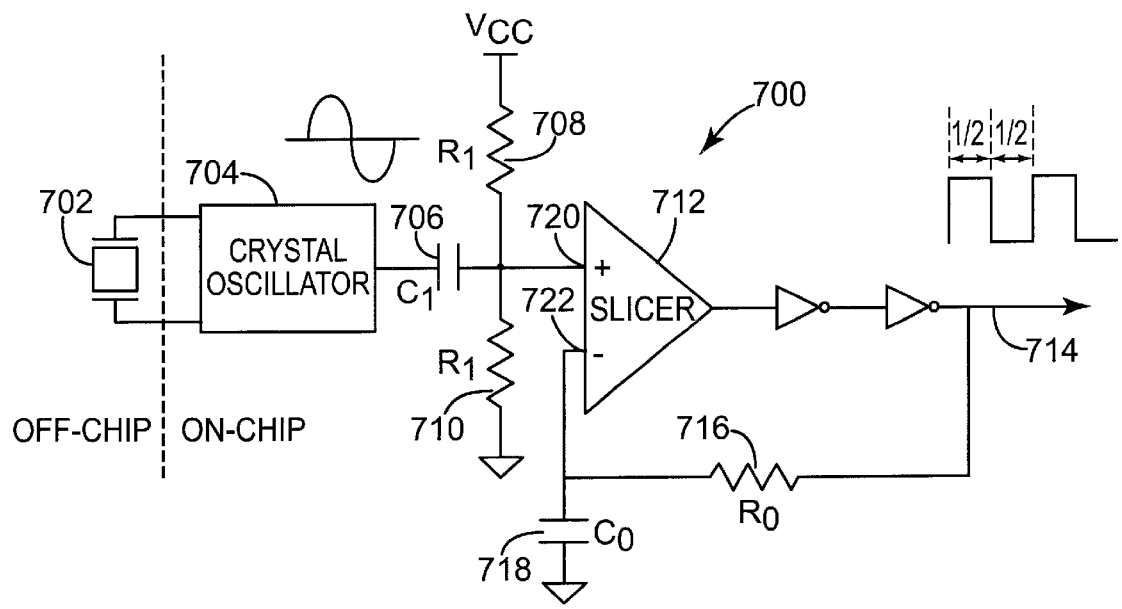
FIG. 7 is a diagram illustrating one embodiment of an apparatus for providing a self-referencing slicer to generate a 50% duty cycle in accordance with the principles of the present invention.

FIG. 7 is a diagram illustrating one embodiment of an apparatus 700 for providing a self-referencing slicer to generate a 50% duty cycle in accordance with the principles of the present invention. An crystal 702 and associated oscillator circuitry 704 provide a raw clock signal. In one embodiment of the invention, the oscillator is a 3-port oscillator that has an approximate sinusoidal output. The sinusoidal nature of a 3-port oscillator is partly due to its design. A crystal can be modeled as a series RLC circuit, neglecting holder capacitance. In a series RLC, the presence of the resistance R causes the oscillations to dampen out. If the effect of this resistor in the overall circuit is compensated, the RLC will look just like an LC, and oscillate indefinitely. One manner of compensating the resistance R is to connect the crystal to a 3-port network that generates an equal and opposite real impedance, also known as a negative impedance. While a 3-port oscillator is applicable in one embodiment of the invention, the invention is not limited thereto, as any oscillator providing a periodic waveform can be used in connection with the invention.

The task of referencing the input sinusoid to exactly $V_{cc}/2$ is effected through the use of a coupling capacitor and a voltage divider. The capacitor C1 706 AC couples the input sinusoid, and the DC level of the sine wave is set using a voltage divider to divide the $V_{CC}$ voltage. This voltage divider is represented by like resistances $R_1$ 708, 710. As will be appreciated by those skilled in the art, the voltage at the non-inverting input of the slicer 712 will have a DC component of $V_{cc}/2$ at the midpoint of like resistances 708, 710.

Figure 8:
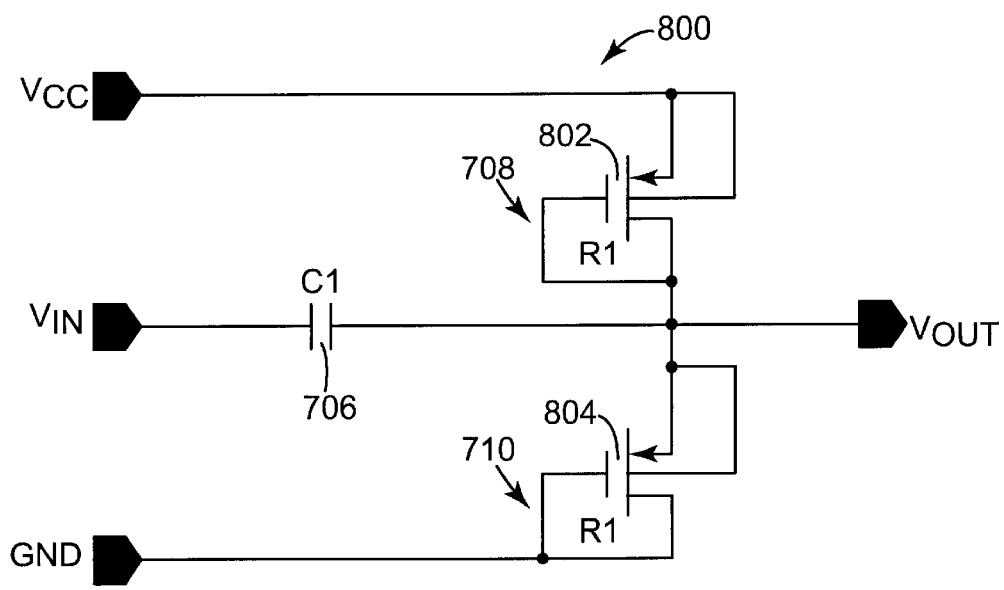
FIG. 8 is a diagram illustrating one embodiment of an AC coupling and voltage division arrangement in accordance with the present invention.

Any manner of providing the voltage division may be used in accordance with the present invention. In one embodiment of the invention, the AC coupling and voltage division is accomplished using the circuit 800 depicted in FIG. 8. The input $V_{IN}$ to the circuit 800 is from the oscillator 704, and is provided to the AC coupling capacitor 706. The two resistances $R_1$ 708 and 710 are devised using field-effect transistors in a manner known to those skilled in the art. The voltage division causes $V_{OUT}$ to have a voltage of $V_{cc}/2$.

Referring again to FIG. 7, the actual threshold voltage at the inverting input of the slicer 712 is derived by averaging the voltage at the output node 714. The resistance $R_O$ 716 connecting the output 714 to capacitance CO 718 form an RC low pass filter. Since the frequency of the output is fixed to that of the crystal (which is typically approximately +/−60 ppm), a corner frequency may be chosen such that only the DC content of the output waveform appears at the inverting input of the slicer 712 (to a first order).

When the oscillating signal (referenced to $V_{cc}/2$ due to the voltage division) is applied to the slicer input 720, it is sliced about the voltage at input 722. If the output duty cycle is not exactly 50%, the voltage at input 722 is adjusted (through duty cycle variation of output), until a voltage is found that gives precisely 50%. For example, if the duty cycle of the output were 40% high and 60% low, then the voltage at input 722 will be below $V_{cc}/2$. This is because the average DC level at the output 714 will be lower than its theoretical DC level due to the reduction in pulse widths while the signal is at a high DC level. As a result, the input sine wave will be sliced at a voltage below its DC level, causing more of the sine wave to be above the threshold than below. This forces the output duty cycle to become more positive. After some time, this loop causes the voltage at input 722 to represent the threshold voltage that will give exactly 50% duty cycle at the output 714.

Figure 9:
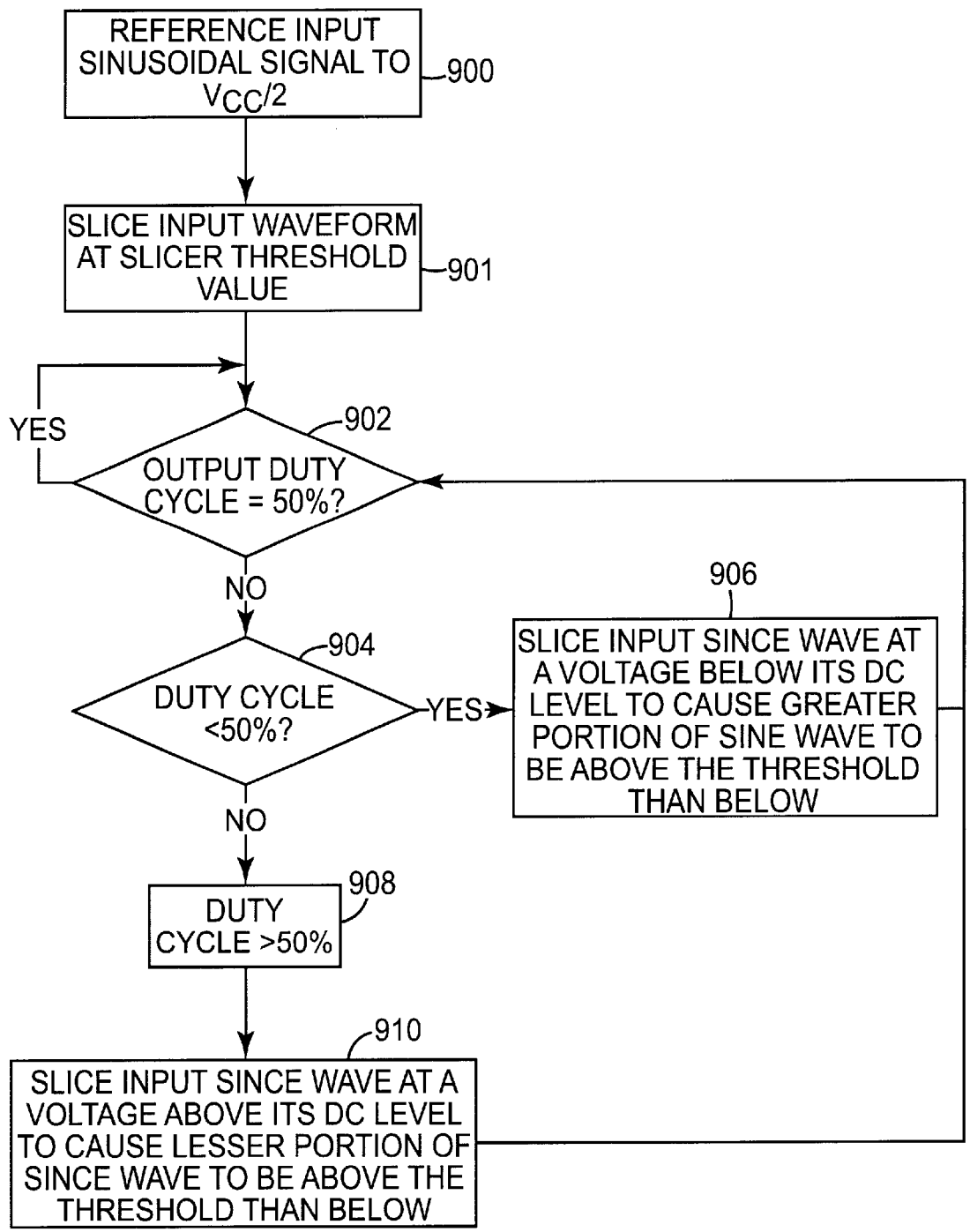
FIG. 9 is a flow diagram illustrating one embodiment of a method for providing a self-referencing slicer to generate a 50% duty cycle in accordance with the principles of the present invention.

FIG. 9 is a flow diagram illustrating one embodiment of a method for providing a self-referencing slicer to generate a 50% duty cycle in accordance with the principles of the present invention. The input sinusoid signal is referenced to $V_{cc}/2$ as depicted at block 900. The input sinusoid is sliced 901 at the slicer threshold value at the reference input (e.g., input 722) of the slicer. If the output duty cycle is equal to 50%, no further action is taken until the duty cycle changes, as shown by the feedback path at decision block 902. If the duty cycle is not equal to 50%, it is determined 904 whether it is below 50%. If so, the voltage at the reference input is below $V_{cc}/2$. In this case, the input sine wave is sliced 906 at a voltage below its DC level to cause a greater portion of the sine wave to be above the threshold than below the threshold. If the duty cycle is not below 50%, it must be greater than 50% as depicted at block 908. This means that the voltage at the reference input is above $V_{cc}/2$, and the input sine wave is sliced 910 at a voltage above its DC level to cause a lesser portion of the sine wave to be above the threshold than below the threshold.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An apparatus for regulating a duty cycle of a digital clock signal, comprising:
    an oscillator generating a substantially sinusoidal signal;
    a voltage divider circuit to generate an input signal from the substantially sinusoidal signal, wherein the input signal has a DC content of approximately one half of a supply voltage;
    a slicer comprising:
        a first input coupled to the voltage divider circuit to receive the input signal;
        a second input coupled to receive a reference voltage; and
        an output to supply the digital clock signal having a 50% duty cycle; and
    a passive feedback circuit coupled between the output of the slicer and the second input of the slicer, wherein only the DC content of the digital clock signal provides the reference voltage at the second input of the slicer.

2. The apparatus as in claim 1, wherein the voltage divider circuit is coupled between two reference voltages to provide the predetermined voltage at the first input.

3. The apparatus as in claim 2, wherein the voltage divider circuit comprises field-effect transistors.

4. The apparatus as in claim 2, wherein the voltage divider circuit further comprises an AC coupling capacitor in series with the input signal.

5. The apparatus as in claim 1, wherein the first input is a non-inverting input and the second input is an inverting input.

6. The apparatus as in claim 1, wherein the slicer is a comparator.

7. The apparatus as in claim 1, wherein the feedback circuit comprises a low-pass filter to pass the DC content of the output digital signal to the second input of the slicer.

8. A method for regulating a duty cycle of a digital clock signal, comprising:
    generating a substantially sinusoidal input signal having a DC content of approximately one half of a supply voltage;
    comparing a reference voltage with the input signal to generate an output digital signal having a 50% duty cycle; and
    automatically adjusting the reference voltage, using a passive low pass filter, in response to changes in the duty cycle of the output digital signal to maintain a 50% duty cycle for the output digital signal.

9. The method according to claim 8, further comprising modifying the input signal by passing a substantially sinusoidal signal through a voltage divider.

10. The method according to claim 9, wherein the voltage divider is constructed using resistors.

11. The method according to claim 9, wherein the voltage divider is constructed using diodes.

12. The method according to claim 8, wherein the reference voltage is generated using a low-pass filter.

13. The method according to claim 12, wherein the low-pass filter comprises a corner frequency chosen to provide only a DC content of the output digital signal as the reference signal.

14. A circuit for regulating a duty cycle of a digital clock signal, comprising:
    an oscillator generating a substantially sinusoidal signal;
    a slicer for comparing a reference voltage with an input signal derived from the substantially sinusoidal signal having a DC content of approximately one half of a supply voltage to generate an output digital signal having a 50% duty cycle; and
    a passive component feedback circuit for automatically adjusting the reference voltage in response to changes in the duty cycle of the output digital signal to maintain a 50% duty cycle for the output digital signal.

15. The circuit according to claim 14, further comprising a voltage divider coupled to the slicer to receive the substantially sinusoidal signal to create the input signal.

16. The circuit according to claim 15, wherein the voltage divider is constructed using resistors.

17. The circuit according to claim 15, wherein the voltage divider is constructed using diodes.

18. The circuit according to claim 14, wherein the reference voltage is generated using a low-pass filter.

19. The circuit according to claim 18, wherein the low-pass filter comprises a corner frequency chosen to provide only a DC content of the output digital signal as the reference signal.

* * * * *